United States Patent [19]

Tamada et al.

[11] Patent Number: 4,642,795
[45] Date of Patent: Feb. 10, 1987

[54] THERMOMAGNETIC RECORDING SYSTEM

[75] Inventors: Hitoshi Tamada, Kawasaki; Masahiko Kaneko; Tsutomu Okamoto, both of Yokohama; Toshiro Yamada, Kamakura, all of Japan

[73] Assignee: Sony Corporation, Tokyo, Japan

[21] Appl. No.: 643,975

[22] PCT Filed: Mar. 30, 1984

[86] PCT No.: PCT/JP84/00152
§ 371 Date: Aug. 20, 1984
§ 102(e) Date: Aug. 20, 1984

[87] PCT Pub. No.: WO84/03991
PCT Pub. Date: Oct. 11, 1984

[30] Foreign Application Priority Data

Mar. 31, 1983 [JP] Japan .................................. 58-55653

[51] Int. Cl.⁴ ............................................. G11C 19/08
[52] U.S. Cl. ...................................... 365/10; 365/122
[58] Field of Search ...................... 365/10, 36, 37, 122

[56] References Cited
U.S. PATENT DOCUMENTS

| | | | |
|---|---|---|---|
| 3,787,825 | 1/1974 | DeJonge | 365/122 |
| 4,012,724 | 3/1977 | Hanson et al. | 365/37 |
| 4,149,265 | 4/1979 | Gorres et al. | 365/37 |

Primary Examiner—James W. Moffitt
Attorney, Agent, or Firm—Hill, Van Santen, Steadman & Simpson

[57] ABSTRACT

A region (21) having different magnetic energy from that of other portion is formed in a layer (1b) of soft magnetic material which has an easy axis of magnetization normal to the layer surface and is magnetized in one direction by applying an external bias magnetic field. By irradiating a light beam on the layer surface, a cylindrical magnetic domain b magnetized in the direction opposite to the magnetization direction is formed at a first stable position of the region (21). This cylindrical magnetic domain is moved to a second stable position by a second cylindrical magnetic domain c·b formed by the irradiation of light beam or by a temperature gradient whereby stable recording, reading thereof and accurate calculation function can be carried out.

5 Claims, 18 Drawing Figures

THERMOMAGNETIC RECORDING SYSTEM

TECHNICAL FIELD

The present invention relates to a thermomagnetic recording system in which the recording of an information on an optical magnetic memory is carried out by the irradiation of light and the information bits thus recorded can be moved to another position.

BACKGROUND ART

There is a known thermomagnetic recording system which uses a layer of soft magnetic material having an easy axis of magnetization normal to the layer surface on which the thermomagnetic recording is performed by irradiating a laser light thereon. The system is disclosed in the publicated document of Japanese Kokai No. 158005/1982 (Japanese patent application, No. 45232/1981) filed by the present applicant. The layer of soft magnetic material having an easy axis of magnetization normal to the layer surface used therein is a layer made of soft magnetic material, for example, YSmCaFeGe-series garnet such as $(YSmCa)_3(FeGe)_5O_{12}$ or the like, having uniaxial magnetic anisotropy strong in the direction normal to the layer surface and an easy axis of magnetization normal to the layer surface. The layer of soft magnetic material having an easy axis of magnetization normal to the layer surface is required to have such soft magnetic property that when this layer is used as a recording medium, the diameter of information bits to be written therein is practically determined only by a bias magnetic field, and the coercive force thereof is desired to be less than about 3 Oe, preferably about 1 Oe or below. This layer of soft magnetic material having an easy axis of magnetization normal to the layer surface is formed by growing on a crystalline substrate of rare-earth gallium garnet such as non-magnetic gadolinium gallium garnet (GGG) by the liquid phase epitaxial (LPE) growth of YSmCaFeGe-series garnet crystal or the like. The writing an information on that layer is carried out such that a bias magnetic field of a predetermined strength is first applied to the layer of the soft magnetic material so as to make the layer magnetized to have a single magnetic domain over the whole layer surface thereof and magnetization directed to the direction perpendicular to the layer surface. Then, under this state, when an optical pulse is incident on the layer surface under being focussed thereon, this light energy is converted to heat energy so as to generate heat by which bits (magnetic bubbles) are formed, or the writing of an information on the layer can be carried out. The bits thus written are cylindrical magnetic domains each having a predetermined diameter and the magnetization directed to the direction opposite to the applied bias magnetic field.

The strength of the bias magnetic field applied to the layer of soft magnetic material so as to produce a single magnetic domain therein over the whole layer surface thereof is selected in a range from the run-out magnetic field to the collapse magnetic field of the material, for example, between 57 Oe and 73 Oe for the LPE layer of $(YSmCa)_3(FeGe)_5O_{12}$. Because the coercive force, particularly magnetic wall coercive force of the layer of soft magnetic material is extremely small and hence the bias magnetic field applied thereto can be small, the bias magnetic field generating means may be a small solenoid coil, rubber magnet or the like.

The reading-out of the information from the magnetized layer on which the recording was made as above is carried out such that a light, for example, a laser light is linearly polarized by a polarizer and then irradiated on the recorded medium. When the linearly polarized light passes through the magnetized layer, it is subjected to the rotation by the Faraday-effect. Then this rotated light is applied through an analyzer into a photo-detecting means so that the output corresponding to the information bits is produced therefrom and hence the reading-out of the information is performed.

According to the above thermomagnetic recording on the LPE magnetic garnet thin film, since its magnetic wall coercive force Hc is as small as about 1 Oe or below, the movement of information becomes possible which could not be carried out by the prior art thermomagnetic recording, namely, Curie point writing, compensation point writing and so on. The movement of information is to move the recorded bit, namely, the magnetic bubble domain recorded at a certain position to other position to thereby give logic calculation function. As a method for carrying out the movement of information bits, there is a method disclosed in the publicated document of Japanese Kokai No. 17505/1983 of the present applicant. The method for moving information bits disclosed therein is such a method that a new bit independent from an information bit, namely, a cue bubble is produced by the radiation of continuous light and the repulsion force between this cue bubble and the magnetic bubble of the already recorded information bit is used to move the information bit. That is, in this method, in order to move a desired information bit from a track along which the information bits are aligned, while applying a bias magnetic field between the run-out magnetic field and the collapse magnetic field to the recorded medium, a substantially continuous light is made incident on a portion of the medium apart from the track by a predetermined distance and the cue bit, which is produced in association with the continuous light, causes the information bit to be moved, which comes near to the cue bubble due to the temperature gradient generated by the irradiation of light, to be repelled outside the track by a repulsive force therebetween. The substantially continuous light mentioned here includes an intermittent light of such an extent that no recording is left even by the irradiation thereof, in addition to the ordinary continuous light and may be any light if a pulse repetition of a beam is enoughly faster than a relative speed between a magnetic thin film and the beam. The substantially continuous light is required to always make one bit, and the intensity thereof is preferably selected such that a bit to be moved, which is drawn toward the bit by the temperature gradient generated from the irratiation of light is not pulled in but repelled to a predetermined distance by the repulsive force. In this case, even if the intensity of the substantially continuous light is large, the repulsive force between the bits can be produced by adjusting the distance of the position on which the light is incident from the track from which the information bit is moved.

According to the above method, it is possible to move the position of the already recorded information bit. In this case, the position to which the information bit is moved is determined by the repulsive force between the bits so that the position to which the information bit is moved is changed by a bias magnetic field. Also the position to which the information bit is moved is changed by the fluctuation of coercive force Hc, so it is difficult to stabilize the position to which the information bit is moved.

In a thermomagnetic recording system in which the thermomagnetic recording for a thin film of soft magnetic material having a low magnetic wall coercive force is carried out by heat generated from the irradiation of light thereon, the present invention is to obviate the above defects and to enable an information bit to be stably moved to a predetermined position.

DISCLOSURE OF INVENTION

The present invention relates to a thermomagnetic recording system in which a layer of soft magnetic material capable of holding and transferring a cylindrical magnetic domains is provided, the layer of soft magnetic material has an easy axis of magnetization normal to the layer surface and is magnetized in one direction by applying an external bias magnetic field thereto, and a cylindrical magnetic domain magnetized in the direction opposite to the magnetization direction is formed by radiating an optical beam on its layer surface. In this case, in the layer of soft magnetic material, there is formed a region having magnetic energy different from that of other region for the cylindrical magnetic domain, wherein a first cylindrical magnetic domain is formed and held at a first stable position in the above region and the first cylindrical magnetic domain is moved along the border of the above region to a second stable position within this area.

A first method for moving the first cylindrical magnetic domain is such a method that a second cylindrical magnetic domain, which is formed for the first cylindrical magnetic domain by irradiating an optical beam, is located at a position apart from the first cylindrical magnetic domain by a predetermined distance and the optical beam, which is in the state of forming the second cylindrical magnetic domain, is moved to move the first cylindrical magnetic domain existing at the first stable position along the border of the region having different magnetic energy from that of other region to the second stable position within this region.

A second method for moving the first cylindrical magnetic domain is such a method that a light is made incident on the position apart by a predetermined distance from the first cylindrical magnetic domain formed and held at the first stable position within the above region to carry out local heating so as to form a temperature gradient at both ends of the first cylindrical magnetic domain so that the first cylindrical magnetic domain is moved along the border of the above region to the second stable position within the above region.

The region having different magnetic energy can be formed in the soft magnetic film by forming a portion having a thickness thinner than other region of the soft magnetic film or by ion implantation selectively.

In addition, the soft magnetic film can be made of garnet film.

BEST MODE FOR CARRYING OUT THE INVENTION

Figure 1:
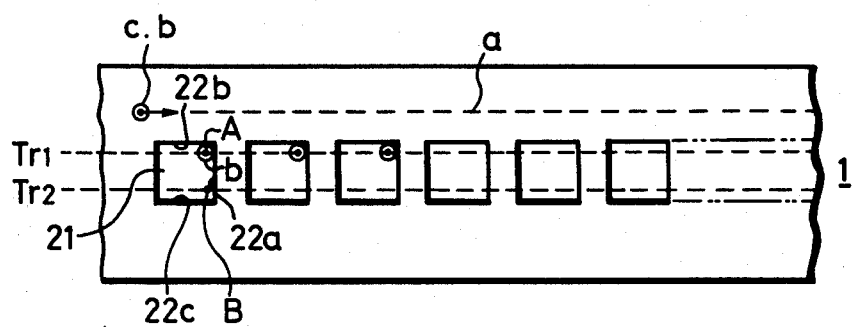
FIG. 1 is a schematically enlarged top view showing an example of a recording medium used in an embodiment of a thermomagnetic recording system according to the present invention.
Figure 2:
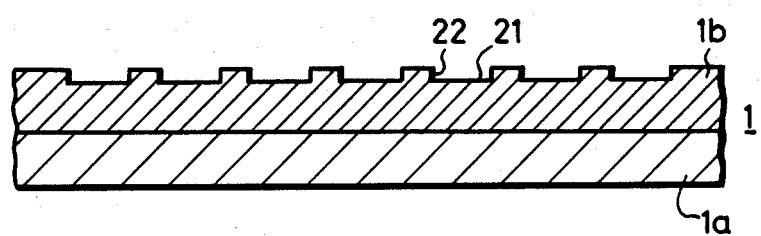
FIG. 2 is a cross-sectional view thereof.

According to the present invention, for example, as shown by an enlarged top view in FIG. 1 and also by a cross-sectional view in FIG. 2, on a garnet substrate $1a$ of $Gd_3Ga_5O_{12}$, a thin film of $(TmBi)_3(FeGa)_5O_{12}$ is grown to have a thickness of 2.0 μm by an LPE technique to form a magnetic layer $1b$ of soft magnetic material having an easy axis of magnetization normal to the layer surface, thereby forming a recording medium 1. On the surface of the soft magnetic layer $1b$ are formed by photolithographic technique regions 21 of square concave portion having a thickness smaller than those of other portions and different magnetic energy for a magnetic bubble from those of other portions which are arranged with a predetermined pitch. Reference numeral 22 designates a stepped portion which is formed in the edge portion of each concave portion, namely, each region 21. In this case, the region, namely, the concave portion 21 is of a square with a side of 6 82 m. The depth thereof is selected to be 500 Å and the distance between the respective concave portions 21 is selected to be 4 μm. An Ar ion laser (having a wavelength of 488 nm) having a writing power of 3.7 mW or above is used as a recording light source in such a manner that the laser light is focussed such that a beam spot on the soft magnetic layer $1b$ is 0.1 μm in diameter. Then, the recording is carried out with the pulse width of the laser light of 5.0 μs to form the information bit, namely, a first information magnetic bubble b within the concave portion 21. In this case, the soft magnetic layer $1b$ was 17.2 emu/cm³ in saturation magnetization, 1100 Oe in magnetic anisotropy field, 0.3 Oe in magnetic wall coercive force and 2.4 μm in diameter of the magnetic bubble under the bias magnetic field of 80 Oe. On the other hand, a continuous laser light is irradiated on the soft magnetic layer $1b$ to form a second cylindrical magnetic bubble, or cue magnetic bubble c·b outside the concave portion 21 apart from the information bit, namely, the information magnetic bubble domain b formed within the concave portion 21, as shown in FIG. 1.

Figure 3A:
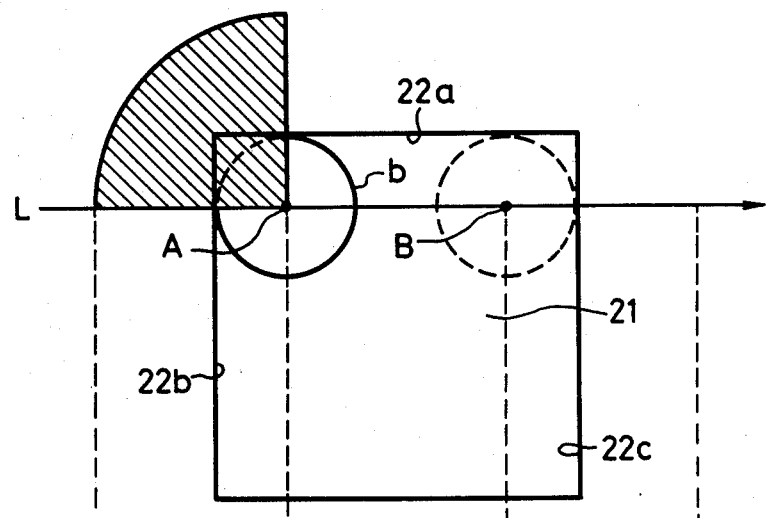
FIGS. 3a and 3b are respectively diagrams showing a relation between a region having different magnetic energy for a magnetic bubble and force acting on a magnetic bubble.
Figure 3B:
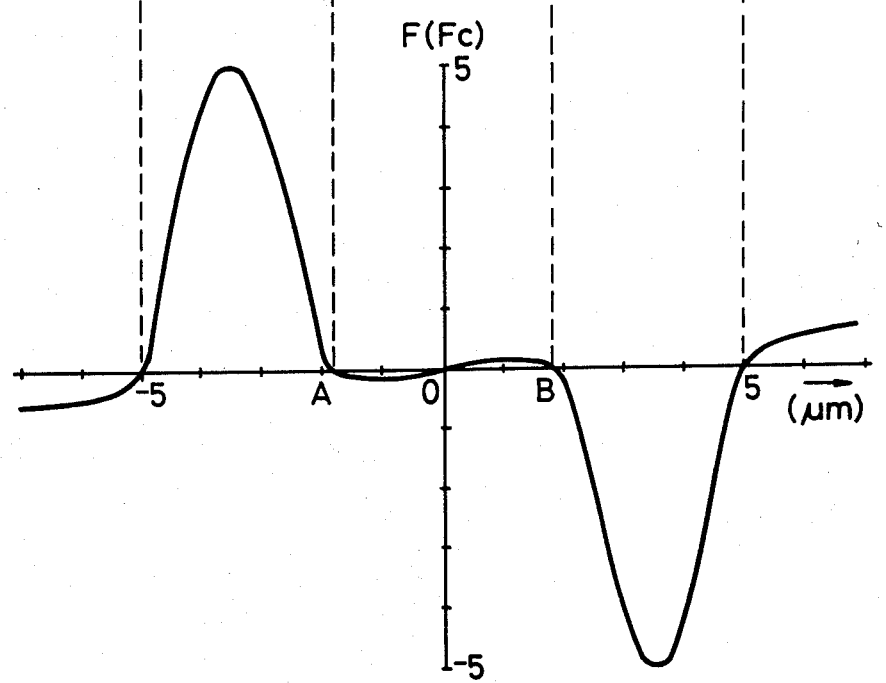

The above information magnetic bubble b will be considered. FIG. 3 shows a relation between the soft magnetic layer (FIG. 3a) which includes the concave portion 21 having the above dimension and shape and a force (FIG. 3b) acting on the bit, namely magnetic bubble b to be recorded thereon. As shown in FIG. 3a, a straight line L will be considered, which extends along a stepped portion 22a formed at one side wall of the concave portion 21 and apart from this side wall by the distance corresponding to the radius of 1.2 μm of the magnetic bubble b. The magnetic energy of the bubble changes at each position on the straight line L and the bubble is given a force corresponding thereto. FIG. 3b shows the experimental results of the force F along the line L acting on the magnetic bubble measured by the following method. The magnetic bubble was moved along the line L by irradiating a continuous laser light at a different position of the soft magnetic layer. The minimum laser power was measured which could move the magnetic bubble against the force acting on the bubble at the stepped portion 22b and 22c. In other words, the minimum laser power $P_1$ by which the bubble was moved from points A to B along the straight line L within the concave portion 21 as shown in FIG. 3a, the minimum laser power $P_2$ by which the bubble was moved from the inside of the concave portion 21 to the outside of the concave portion 21 and the minimum laser power $P_3$ by which the bubble was moved from the outside of the concave portion 21 into the concave portion 21 were respectively measured. On the other hand, the minimum laser power $P_0$ by which the bubble was moved against the magnetic wall coercive force Hc of the soft magnetic layer 1b in the place having no stepped portions was measured. That is, the force exerted on the bubble by the power $P_0$ is equal to a force Fc (Fc=4 dhMsHc) caused by the coercive force Hc. A force Fd for a laser light to attract a bubble is given as $$Fd = \pi d^2 h(2\pi Ms)\left(C_M\left(\frac{dMs}{dT}\right)/Ms - C_\sigma\left(\frac{d\sigma w}{dT}\right)/\sigma w\right) \cdot |grad\ T| \quad (1)$$

where d is the diameter of bubble, h is the film thickness, Ms is the saturation magnetization, $\sigma w$ is the magnetic wall energy density, $C_M$ and $C_\sigma$ are respectively the positive constants and grad T is the temperature gradient formed by the irradiation of the laser light. Although the average temperature of the bubble is increased by the irradiation of the laser light, each component of d, Ms, $\sigma w$, $C_M$ and $C_\sigma$ can be considered as substantially a constant value in the range where the average temperature is not so high as compared with the room temperature. As a result, Fd is proportional to the temperature gradient, grad T or the laser light power. Consequently, if the ratio of the power $P_0$ with each of powers $P_1$, $P_2$ and $P_3$ is calculated, it is possible to obtain the force F which is exerted from the stepped portion 22 due to the difference of the film thickness on the basis of the Fc. The calculated results as set forth above are shown in FIG. 3b, and in this graph, the abscissa indicates each position on the straight line L in FIG. 3a in correspondence with FIG. 3a, while the ordinate indicates the force F(Fc) which is exerted on the bubble. The force F acting in the right-hand direction in FIG. 3a is taken as being positive, while the force acting in the opposite direction is taken as being negative. From this graph, it is clear that within the area from the left and right edge portions of the concave portion 21, namely, the stepped portions 22b and 22c to the outside of the concave portion 21 by about 2 μm., the bubble is given a force which pushes the bubble b back into the concave portion 21 and hence the bubble b is strongly restrained within the concave portion 21. Further, it was confirmed that the magnetic bubble was stably formed at point A, when the light pulse for writing was irradiated in the hatched area of FIG. 3a. The hatched area is a ¼ area of a circle having a radius of 3.2 μm with a center at the point A, where the point A is remote from the side walls 22a and 22b by distance 1.2 μm which is a radius of the nucleated magnetic bubble. This similar feature occurs in any one of four corner portions of the concave portion 21 because the shape of the concave portion 21 is symmetrical.

Further, it was confirmed that the magnetic bubble was so stably formed at each corner position of the concave portion 21 that the magnetic bubble was in contact with the side walls in the concave portion, even the diameter of the magnetic bubble was varied by changing the bias magnetic field. When the diameter of the nucleated magnetic bubble was 1.8 μm. For a magnetic bubble having diameter of 1.8 μm, the magnetic bubble was stably formed at the corner of the concave portion 21, when the light pulse was irradiated in an area of ¼ of a circle having a diameter of 2.6 μm with its center at the center of the bubble of stable position.

Within the concave portion 21, the influence caused by the difference of the film thickness for the magnetic bubble is so small that the magnetic bubble b is in the state of being easily moved from the point A to the point B.

The information magnetic bubble thus formed within the concave portion 21 is moved to other position by a magnetic repulsive force generated between both of the bubbles c·b and b.

This repulsive force Fi is given as $$Fi = \frac{3}{4}\left(\frac{d}{D}\right)^4 (\pi h Ms)^2 \quad (2)$$

where D is the distance between the both bubbles c·b and b.

Figures 4A, 4B, 4C:
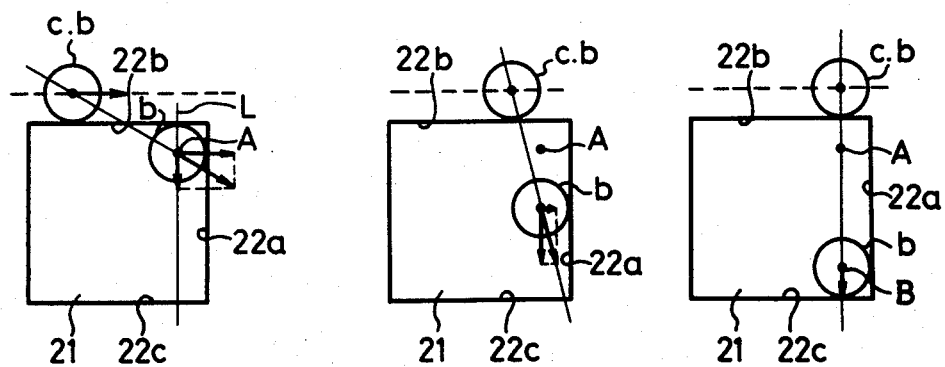
FIGS. 4a to 4c are respectively diagrams useful for explaining the movement of an information bubble.

As shown in FIGS. 4a to 4c, a continuous laser light was made incident at the position apart by a distance of 0.5 μm from the side wall 22b of the concave portion 21. This continuous laser light is relatively moved along the stepped portion 22b from the left-hand side to the right-hand side relative to the concave portion 21 in FIG. 4, the information bubble b was moved from the point A to the point B along the side wall 22a. This movement could be stably carried out by the continuous laser light (CW light) having a power ranging from 0.5 to 1.2 mW.

Figure 5:
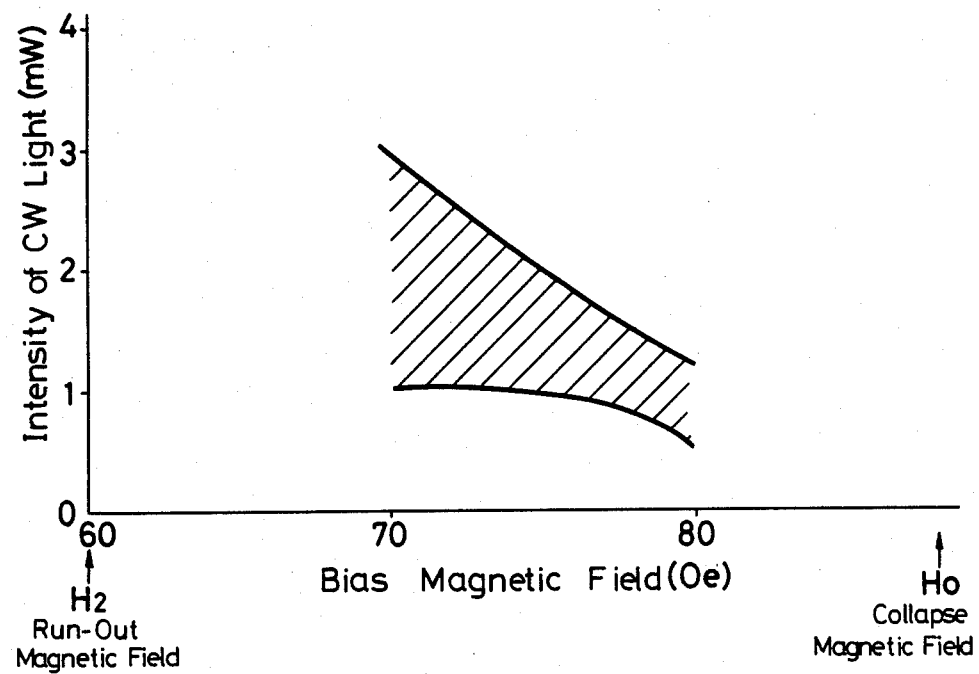
FIGS. 5 and 11 are respectively graphs useful for explaining a relation between a bias magnetic field and a power of laser light for movement.

FIG. 5 shows a relation between the bias magnetic field and the power of the CW light, where the hatched area shows the region that the magnetic bubble b can be stably formed was moved from the point A to the point B, when the bubble diameter was varied by changing the bias magnetic field.

Figure 6:
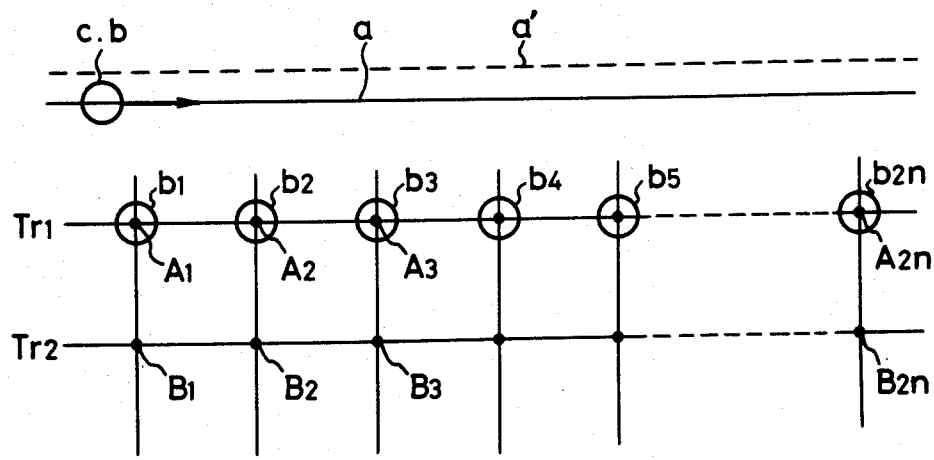
FIG. 6 is a pattern diagram useful for explaining the present invention.

The fact that the information magnetic bubble b can be moved from the point A, the first stable position to the point B, the second stable position along the side wall 22a is carried out by the binding force produced at the above stepped portion to the magnetic bubble. In the recording medium in which the concave portions 21 are arranged along one straight line as shown in FIG. 1, each point A in each concave portion 21 is taken as a first track Tr1 and each point B in the concave portion is taken as a second track Tr2, by the fact that as shown in FIG. 6, the CW light, namely, the cue bubble c·b is moved along a straight line a apart by a predetermined distance from the track Tr1, the information bubble b (b1, b2, b3 . . . b2n) at each point A (A1, A2, A3 . . . A2n) in each concave portion 21, namely, on the track Tr1 can be moved to each corresponding point B (B1, B2, B3 . . . B2n) within each concave portion 21, namely, the track Tr2. It was confirmed that in order to inhibit the movement of the information bubble, the movement locus of the cue bubble c·b was moved to a straight line a' enoughly distant from the concave portion 21 having the information bubble b which has to be inhibited from being moved.

Figure 7A:
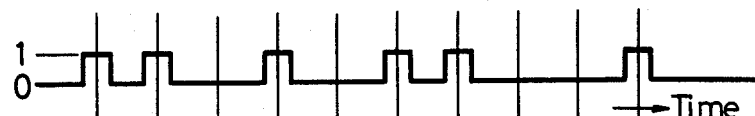
FIGS. 7 to 9 are respectively diagrams useful for explaining the logical calculation.

Owing to the movement of the information bubble b from the track Tr1 to the track Tr2, it is possible to carry out, for example, the logical calculation. First, a case where an AND calculation function is carried out by the system of the present invention will be described. In this case, a description will be given to a case where the logic calculation is carried out for two input signals having logic levels "0" and "1" as, for example, shown in FIGS. 7a and 7b. On the basis of, for example, one input signal as shown in FIG. 7a, the information recording bit is formed on the first track Tr1 at the position corresponding to the logic level "1" of the input signal by the afore-mentioned method. That is, by the light pulse corresponding to the input signal with the level "1" shown in FIG. 7a, its information bits b are formed as shown in FIG. 8. On the other hand, the CW light for movement is moved on the above straight line a in correspondence with the logic level "1" in the second input signal as shown in FIG. 7b.

Figure 7B:
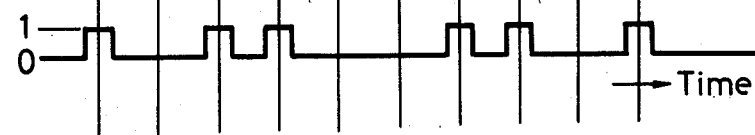
Figure 8:
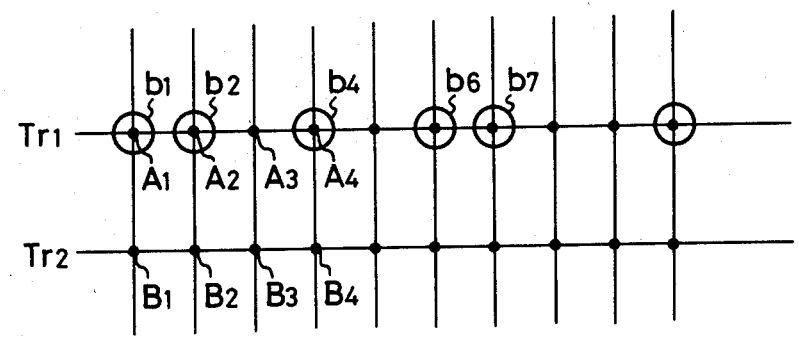
Figure 9:
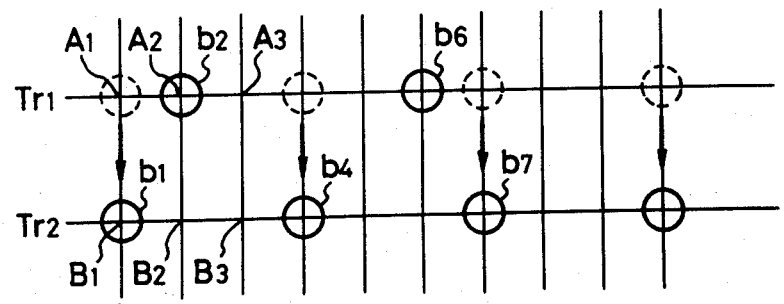

Thus, since as shown in FIG. 9 the recording bit on the track Tr1 is moved to the track Tr2 at the position corresponding to a timing at which the logic levels "1" of FIGS. 7a and 7b are coincident with each other, then the information bit moved to the track Tr2 is read out, to obtain an output of AND calculation.

As described above, according to the present invention, the layer 1b of soft magnetic material having an axis of easy magnetization normal to the layer surface is formed on the garnet substrate 1a. If necessary, it is possible that on the surface of the substrate 1a, for example, opposite to that having the layer 1b of soft magnetic material, is deposited a non-reflection coating layer and on the layer 1b of soft magnetic material is deposited a reflection film such as an Al evaporated film or the like on which a protective film such as an SiO$_2$ film and so on are further formed.

Figure 10:
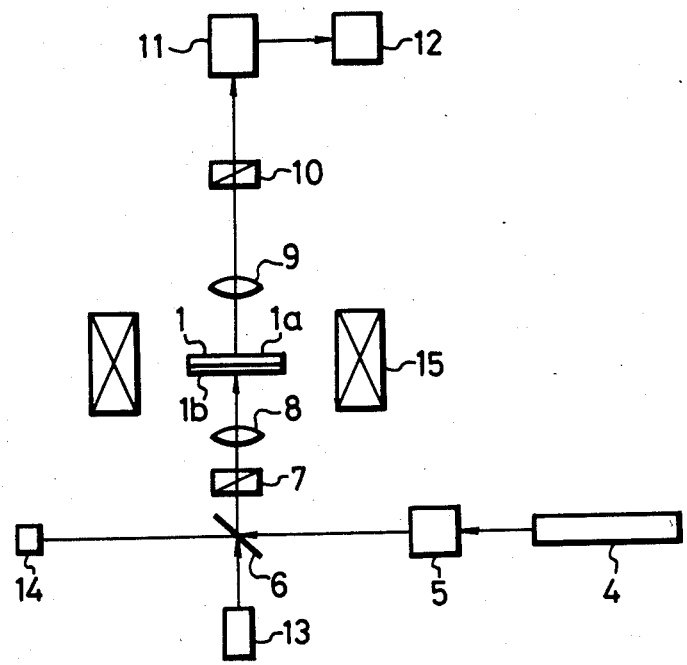
FIG. 10 is a diagram of an example of an apparatus which carries out the system of the present invention.

An apparatus for carrying out the thermomagnetic recording on and reading from the medium 1 is such one that as shown in FIG. 10, the laser light emitted from an Ar ion laser 4 is made through an optical modulator 5 to be a light pulse or a continuous light, as required. This light therefrom is made incident on the layer 1b of soft magnetic material of the recording medium 1 through a half mirror 6, a polarizer 7 and a condenser lens 8. At that time, the intensity of the light incident on the recording medium 1 was corrected and measured by a photo detector 14. Whether or not the information bit was recorded on the layer 1b of soft magnetic material and whether or not the information bit was moved to a predetermined position were confirmed as follows. The light from a mercury lamp 13 is irradiated on the soft magnetic layer of the medium 1 through the half mirror 6, the polarizer 7 and the condenser lens 8 and then focussed through an objective lens 9 and an analyzer 10 on a television camera 11. And, the optical image thereon was observed by a monitor television receiver 12. In the figure, reference numeral 15 designates a bias magnetic field generating means formed of, for example, a permanent magnet. Though not shown, the medium 1 is mounted on a stage having a mechanism capable of being moved in the two directions perpendicular to each other. While in the above example the region 21 having different magnetic energy from that of the other regions is formed of the concave portion, this region may be formed by ion implantation to the layer 1b of soft magnetic material. The region 21 formed by the ion implantation may be formed by implanting, for example, hydrogen ion H$^+$ with a dose amount of $1 \times 10^{15}$ (cm$^{-2}$) at an accelerating voltage of 70 keV.

Figure 11:
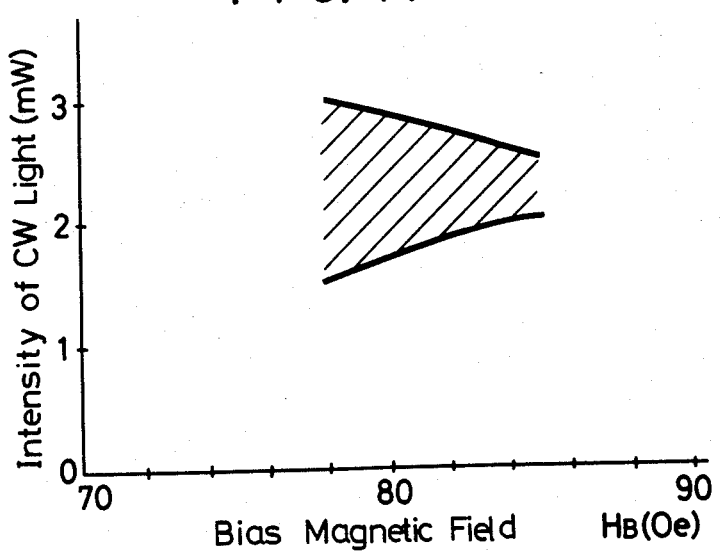

The first cylindrical magnetic domain, namely, the bubble b can be moved from the first stable position, the point A in the region 21 made by such ion implantation to its second stable position, the point B by the magnetic repulsive force acting between the cue bubble c·b and the information magnetic bubble similarly to the above. In this case, when the bias magnetic field was changed, the range of the CW light by which the bubble b can stably be moved from the point A to the point B was within the hatched area in the graph of FIG. 11.

While in the above example the first cylindrical magnetic domain, namely, the information magnetic bubble b is moved from the first stable position to the second stable position by the second cylindrical magnetic domain, namely, the cue bubble c·b, the bubble b located at the first stable position can be moved by irradiating a light on a position apart from the bubble by a predetermined distance having an intensity enough to cause a temperature difference between both ends of the bubble. This example will be described. For example, by the similar ion implantation as mentioned above, as shown in FIG. 12, the regions 21, each having different magnetic energy from that of the other portion are formed in line with one another, in which the magnetic bubbles b (b1, b2, b3 . . . ) were formed at positions A (A1, A2, A3 . . . ) by the similar method as above, for example, the light pulse of Ar ion laser. The magnetic bubbles b thus made are moved to other stable positions B (B1, B2, B3 . . . ) by a temperature distribution produced within the soft magnetic layer by the irradiation of light pulse and hence by an attractive force attracting the magnetic bubbles to the position which is irradiated with the light pulse. By way of example, by irradiating the light pulse on the positions B, the bubbles b (b1, b2, b3 . . . ) recorded at the positions A are moved to the positions B. The relation between the minimum power Ps necessary for the movement and the bias magnetic field H$_B$ became as shown by a curve 32 in the graph of FIG. 13. Moreover, the relation between the minimum power Pw necessary for recording the above recording bubble b and the bias magnetic field H$_B$ became as shown by a curve 31 in the graph of FIG. 13. Therefore, the range capable of the bit movement, namely, the bit moving margin became the area encircled by the curves 31 and 32.

Figure 12:
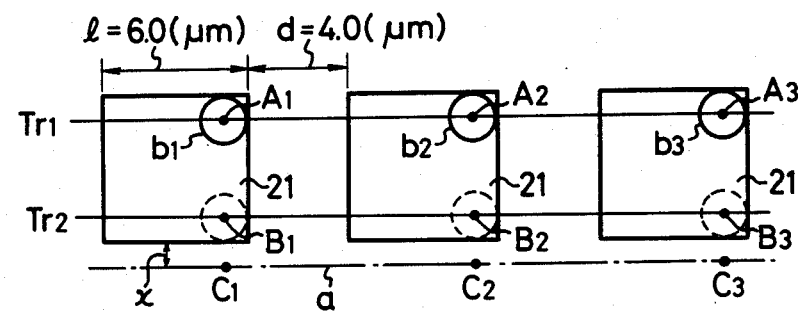
FIG. 12 is a pattern diagram useful for explaining an embodiment of a system according to the present invention.
Figure 13:
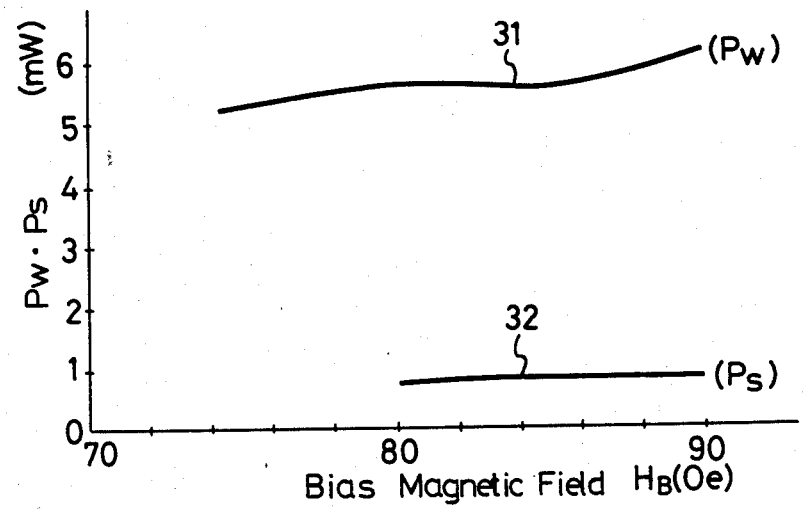
FIG. 13 is a graph showing a relation between its bias magnetic field and a light power.

Next, the bias magnetic field H$_B$=78 Oe, the moving pulse light power Ps'=4 mW and the irradiation positions were selected as points C1, C2, C3 . . . which oppose to the points B and are apart from the edge portions of the regions 21 by a distance x as shown by one-dot chain line a in FIG. 12. At that time, when x≲1.5 μm, the bubbles at the positions A1, A2, A3 . . . were stably moved to the positions, B1, B2, B3 . . . When Ps''=2 mW, x≃0 μm was established. The reason why even if the light pulse is irradiated on the positions C1, C2, C3 . . . , the bubbles remain at the positions B1, B2, B3 . . . as mentioned before is based on the force F described in connection with FIG. 3. That is, even when the irradiation position of the moving light pulse is fluctuated, the position to which the bubble is moved is determined as any one of B1, B2, B3 . . . or the position to which the recording bit is moved was stabilized.

Figure 14:
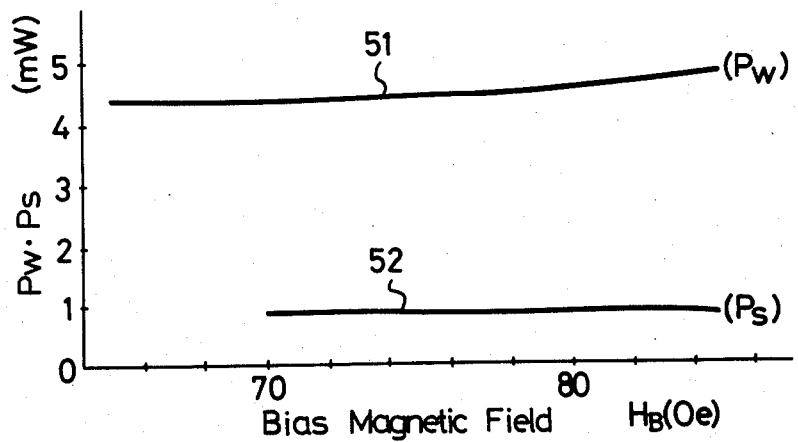
FIG. 14 is a graph showing a relation between its bias magnetic field and a light power.

The movement of the bubble b by the temperature distribution can also be applied to a case in which the region 21 is formed as the concave portion, that is the thickness thereof is reduced as compared with that of other portion as described above. In this case, the relation between the minimum power Pw necessary for recording and the bias magnetic filed $H_B$ became as shown by a curve 51 in the graph of FIG. 14. However, in this case, the Ar ion laser (having the wavelength of 488 nm) was incident on the layer 1b of soft magnetic material with the diameter of beam spot being selected about 1 μm or below for 5.0 μsec. Next, the moving light pulse was made incident on the second stable position B to thereby move the bubble b recorded at the position A to the position B. At that time, the relation between the minimum power Ps necessary for the movement and the bias magnetic field $H_B$ became as shown by a curve 52 in the graph of FIG. 14. Therefore, in that case, the bit moving margin became the area encircled by the curves 51 and 52. Then, the bias magnetic field $H_B=77$ Oe and Ps'=4 mW (Ps' was the power of the moving light pulse) and the irradiation positions were selected as positions C (C1, C2, C3 . . . ) which are apart from the one edge portion of the region 21 by a distance x and oppose the positions B as shown by the one-dot chain line a. At that time, when $x \leq 1$ μm, the bubbles at the positions A were stably moved to the positions B. Under the condition that $H_B=85$ Oe and Ps'=4 mW were established, $x \lesssim 0$ μm was satisfied. Also in this case, due to the action of the force as described with reference to FIG. 3, the bubble b is moved along the side edge of the region 21 and remained at the position B. As described above, even in the case where the region 21 having the different magnetic energy was formed by the ion implantation technique, even if the position irradiated with the moving light pulse was fluctuated, the position to which the bubble was moved could be set at the position B and thus the position to which the recording bit was moved could be stabilized.

While in the above examples the region 21 formed of the concave portion by the ion implantation or ion etching and the like is larger than the magnetic bubble b in size, in some cases, the region 21 may be formed as various shapes such as square, rectangular, circular shapes and so on having width, side or diameter corresponding to or smaller than the diameter of the magnetic bubble b. With these cases, the position of the magnetic bubble can be stabilized, too.

As set forth above, according to the present invention, since the region 21 having the different magnetic energy is formed in the layer of soft magnetic material by the ion implantation technique or making the concave portion, namely, the force acting on the magnetic bubble in accordance with the change of the magnetic energy is used to determine the position of the recording bubble, even if there is a fluctuation such as a small scattering, vibration and so on in the writing of bubble, the formation of cue bubble for the movement or the irradiation position of light which causes the temperature gradient, it is possible to carry out the stable operation. As a result, the designing and manufacturing of the apparatus can be simplified. Further, when the invention is applied to various logical calculations, without mis-operation, a desired logical calculation can be carried out accurately. Furthermore, since the position to which the bubble b is moved is determined precisely by the region 21, it is possible to remove such defect that the position to which the bubble is moved is changed by the fluctuation of the coercive force Hc. Thus there is a great practical advantage of carrying out the accurate reading and so on.

What is claimed is:

1. A thermomagnetic recording system in which a layer of soft magnetic material capable of holding and moving cylindrical magnetic domains is provided, said layer of soft magnetic material having an easy axis of magnetization normal to the layer surface and being magnetized in one direction by applying an external bias magnetic field thereto, and a cylindrical magnetic domain magnetized in the direction opposite to said magnetization direction is formed in said layer by irradiating a light beam on said layer surface, wherein said layer of soft magnetic material is provided with a region having different magnetic energy from that of other region for said cylindrical magnetic domain, said cylindrical magnetic domain is held at a first stable position within said region, another cylindrical magnetic domain formed by the irradiation of a light beam is placed at a position apart by a predetermined distance from said cylindrical magnetic domain held at said first stable position and said light beam, under the condition that said light beam moves together with said another cylindrical magnetic domain, is moved to thereby move said cylindrical magnetic domain positioned at said first stable position along the border of said region to a second stable position within said region.

2. A thermomagnetic recording system in which a layer of soft magnetic material capable of holding and moving cylindrical magnetic domains is provided, said layer of soft magnetic material having an easy axis of magnetization normal to the layer surface and being magnetized in one direction by applying an external bias magnetic field thereto, and a cylindrical magnetic domain magnetized in the direction opposite to said magnetization direction is formed in said layer by irradiating a light beam on said layer surface, wherein said layer of soft magnetic material is provided with a region having different magnetic energy from that of other region for said cylindrical magnetic domain, said cylindrical magnetic domain is held at a first stable position within said region and a light is irradiated at a position apart by a predetermined distance from said cylindrical magnetic domain to carry out local heating which causes a temperature difference across both ends of said cylindrical magnetic domain, whereby said cylindrical magnetic domain is moved along the border of said region to a second stable position within said region.

3. A thermomagnetic recording system according to claims 1 and 2, wherein said region having different magnetic energy is formed to have a thickness thinner than that of other region formed in said layer of soft magnetic material.

4. A thermomagnetic recording system according to claims 1 and 2, wherein said region having different magnetic energy is formed by a selective ion implantation technique.

5. A thermomagnetic recording system according to claims 2 to 5, wherein said layer of soft magnetic material is made of soft magnetic garnet.

* * * * *